United States Patent
Gao

(10) Patent No.: US 11,690,200 B2
(45) Date of Patent: Jun. 27, 2023

(54) SERVER LIQUID COOLING FLUID CUTOFF SYSTEM

(71) Applicant: Baidu USA LLC, Sunnyvale, CA (US)

(72) Inventor: Tianyi Gao, Sunnyvale, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 65 days.

(21) Appl. No.: 17/302,719

(22) Filed: May 11, 2021

(65) Prior Publication Data

US 2022/0369518 A1    Nov. 17, 2022

(51) Int. Cl.
*H05K 7/20* (2006.01)
*H01R 12/71* (2011.01)

(52) U.S. Cl.
CPC ......... *H05K 7/20781* (2013.01); *H01R 12/71* (2013.01); *H05K 7/20272* (2013.01)

(58) Field of Classification Search
None
See application file for complete search history.

(56) References Cited

U.S. PATENT DOCUMENTS

| | | | |
|---|---|---|---|
| 9,439,327 B1* | 9/2016 | Sheng | H05K 7/207 |
| 11,419,243 B2* | 8/2022 | Chen | H05K 7/20272 |
| 2004/0025949 A1* | 2/2004 | Wygnaski | F16K 31/082 |
| | | | 137/66 |
| 2009/0161284 A1* | 6/2009 | Maraval | B66C 1/08 |
| | | | 361/144 |
| 2018/0131128 A1* | 5/2018 | Franz | H01R 13/5219 |
| 2022/0151114 A1* | 5/2022 | Heydari | H05K 7/20836 |

* cited by examiner

*Primary Examiner* — Courtney L Smith
(74) *Attorney, Agent, or Firm* — Womble Bond Dickinson (US) LLP

(57) ABSTRACT

A server liquid cooling fluid cutoff system including a server connector module, a leaking sensor, and an electromagnet device is proposed in the current application. In one embodiment, a server connector module is to be mounted on a server chassis, and the server connector module has at least a pair of server blind mating connectors capable of being engaged with or disengaged from at least a pair of rack blind mating connectors of a rack manifold of the electronic rack coupled to an external cooling fluid source. In an embodiment, a leaking sensor is configured to detect leakage of the cooling fluid within the server chassis. In an embodiment, an electromagnet device is coupled to the server connector module and the leaking sensor. In an embodiment, an elastic structure is coupled to the connector module for pushing the connector away.

20 Claims, 8 Drawing Sheets

SERVER LIQUID COOLING FLUID CUTOFF SYSTEM

FIELD OF THE INVENTION

Embodiments of the present invention relate generally to data center and server cooling. More particularly, embodiments of the invention relate to a server liquid cooling fluid cutoff system.

BACKGROUND

Cooling is a prominent factor in a computer system and data center design. The number of high performance electronics components such as high performance processors packaged inside servers has steadily increased, thereby increasing the amount of heat generated and dissipated during the ordinary operations of the servers. The reliability of servers used within a data center decreases if the environment in which they operate is permitted to increase in temperature over time. Maintaining a proper thermal environment is critical for normal operations of these servers in data centers, as well as the server performance and lifetime. It requires more effective and efficient cooling solutions especially in the cases of cooling these high performance servers.

It is important to keep high reliability in liquid cooling. Therefore, minimizing the amount of the fluid leaking which gets exposed to the electronics is important for deploying this technology in data centers on a large scale.

The conventional solutions may use fluid shutdown valves to cut the fluid circuit. However, this design introduces additional fluid parts to the system. Similarly, other conventional solutions may use an individual pump for each loop, and the pump is shut down in a leakage incident. However, none of the existing solution may qualify or be appropriate for server liquid or electronics cooling

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
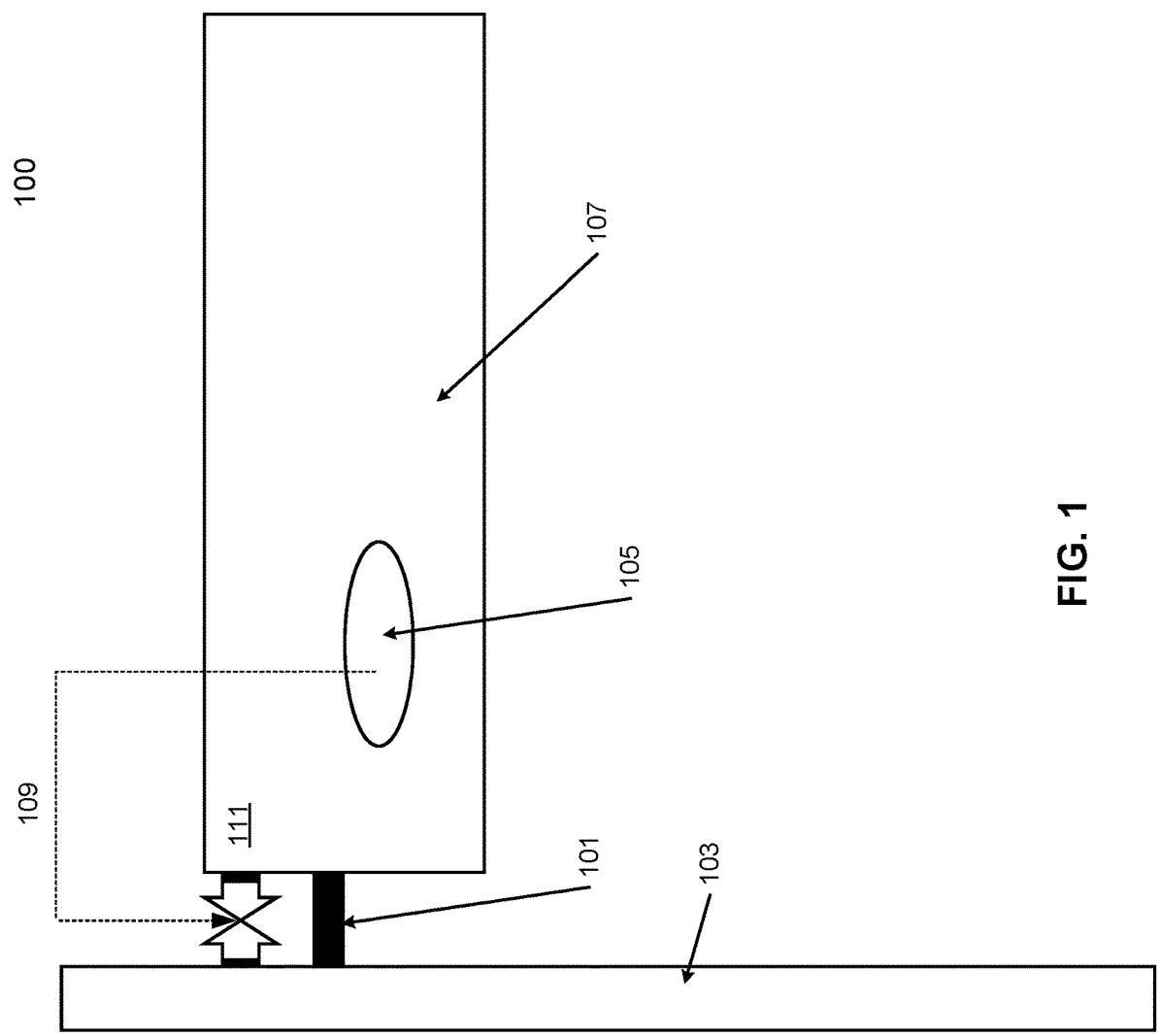
FIG. 1 shows a side view of an example server liquid cooling fluid cutoff design according to an embodiment of the application.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

The information technology (IT) hardware industry is a critical market for many reasons: it plays a crucial role in business competitiveness, service quality and availability, and also plays a significant role in the infrastructure total cost of ownership (TCO). IT hardware is closely linked with the profit of an organization. It is one of the core competencies of the internet giant, cloud computing service providers, as well as high performance computing and artificial intelligence (AI) computing related business service users and providers who build, operate, compute, store and manage other IT hardware platforms (e.g., servers) and infrastructures. The majority of the hyper-scale owners are customizing full-stacks of these hardware systems. For instance, in the rapidly growing cloud computing business, the performance and cost (both capital cost and operation cost) of computing and storage hardware systems, clusters and infrastructure, all require the service providers to create customized systems that fit their individual needs the best. These markets require continuous innovation. An efficient system design and operation benefits the service providers in multiple aspects in a long term. The key to this is to develop continuously with more resilience, efficiency, interoperable and cost effective solutions and architecture.

The disclosure aims to provide an advanced server liquid cooling leakage shutoff system used for both server and rack liquid system designing and liquid server control and monitoring. This system is especially important when it comes to the leakage response system. In addition, the following items serve as additional challenges that the current work aims to solve: quick system shutdown in leakage scenario, simplified control for fluid shutdown system, high reliability, ease of implementation, cost reduction, and vastly compatible with different cases.

The present application introduces a fluid shutoff solution in response to a leakage detection, which includes a device that automatically disconnects the blind mating connectors between the rack and server during a leakage detection scenario according to an embodiment. In an embodiment, the device is enabled to either push the server chassis to disconnect from the rack connectors on the rack manifold, or to push the connector modules of the server chassis away from the rack connectors, while the server chassis remains steady. In an embodiment, the device can be integrated with fluid connectors as one combined module. In an embodiment, an electromagnet circuit is used for generating a pressure or a magnetic force to cause either the server or the connector module to disconnect from the rack manifold. In an embodiment, in normal operations, the electronic magnet is connected to a direct-current (DC) voltage source. The DC source is cutoff in a leaking incident, triggered by the leakage sensor. Then, the loss of magnetism due to the loss of power will cause the displacement of the connectors.

In an embodiment, a server chassis of an electronic rack includes a server connector module, a leaking sensor, and an electromagnet device. For example, a server connector module having a pair of server blind mating connectors capable of being engaged with or disengaged from a pair of rack blind mating connectors of a rack manifold of the electronic rack coupled to an external cooling fluid source.

In an embodiment, the server blind mating connectors are configured to supply cooling fluid to one or more cooling devices attached to one or more electronic devices contained within the server chassis for providing liquid cooling. In an embodiment, a leaking sensor is configured to detect leakage of the cooling fluid within the server chassis. In an embodiment, an electromagnet device is coupled to the server connector module and the leaking sensor.

In an embodiment, the electromagnet device includes an electromagnet and a controller coupled to the electromagnet. For example, in response to a leakage signal received from the leaking sensor indicating that a fluid leakage occurs, the controller may modify a magnetic field associated with the electromagnet, which causes at least one of the server blind mating connectors to disengage from at least one of the rack blind mating connectors. For example, in response to a leakage detection detected by a leakage sensor, the controller sends a signal to control the power provided to the electromagnet, i.e., reduce or cut off the power to the electromagnet. The reduced or cut off power may cause the electromagnet to reduce or lose the magnetic force that attracts the connector module towards to the rack manifold. As a result, the connector module may move away from the rack manifold, which cause the server connectors of the connector module to disengage from the corresponding rack connectors of the rack manifold.

In an embodiment, the server connector module is attached onto a rear side of the server chassis within the server chassis. In an embodiment, the electromagnet is connected to an electrical circuit coupled with a direct current (DC) voltage source. In an embodiment, the controller having a switch used on the electrical circuit controlled by the leaking sensor.

In an embodiment, the server connector module is pushed away from the server chassis when the magnetic field associated with the electromagnet is modified to loss magnetism, which causes at least one of the server blind mating connectors to disengage from at least one of the rack blind mating connectors. In an embodiment, when the server connector module is pushed away from the server chassis, the server chassis and the rack manifold are remained without moving. In an embodiment, the pair of server blind mating connectors include a supply connector coupled with the server chassis through a supply connector holder to supply the cooling fluid to flow from the rack manifold to the server chassis.

In an embodiment, the pair of server blind mating connectors include a return connector coupled with the server chassis through a return connector holder to return the cooling fluid to flow from the server chassis to the rack manifold. In an embodiment, the supply connector is pushed away from the server chassis, the cooling fluid is prevented to flow from the rack manifold to the server chassis. In an embodiment, the return connector is pushed away from the server chassis, the cooling fluid is prevented to flow from the server chassis to the rack manifold. In an embodiment, the server connector module is attached onto a rear side of the server chassis outside of the server chassis.

In an embodiment, the server connector module is pushed away from the server chassis when the magnetic field associated with the electromagnet is modified to loss magnetism, which causes at least one of the server blind mating connectors to disengage from at least one of the rack blind mating connectors. In an embodiment, the server connector module is pushed away from the rack manifold when the electromagnet device losses magnetism, which causes at least one of the server blind mating connectors to disengage from at least one of the rack blind mating connectors.

In an embodiment, an electronic rack comprises a rack manifold and a plurality of server chassis arranged in a stack. For example, the rack manifold is coupled to an external cooling fluid source to receive and to return cooling fluid from and to the external cooling fluid source. In an embodiment, the rack manifold comprises a plurality of pairs of rack blind mating connectors. In an embodiment, each server chassis comprises a server connector module, a leaking sensor, and an electromagnet device. In an embodiment, a server liquid cooling fluid cutoff system comprises a server connector module, a leaking sensor and an electromagnet device.

FIG. 1 shows a side view of an example server liquid cooling fluid cutoff design 100 according to an embodiment of the application. For example, FIG. 1 shows the design concept introduced in the present application. In an embodiment, a device (e.g., an electromagnet device 111) is deployed either between server chassis 107 and rack manifold 103, or within server chassis 107. In an embodiment, the blind mating connectors (e.g., 101) are disconnected in a leaking incident, automatically triggered 109 (e.g., controlled by a controller in response to a leakage signal obtained from leakage sensor 105) by the incident without any complex or a control.

In an embodiment, it can be seen that the blind mating connectors 101 requires the proper placement of the two to be able to function properly. For example, the two arrows shown in the FIG. 1 represent the device (e.g., an electromagnet device 111) as well as its function: to push the server chassis 107/server connector 101 away from the rack manifold 103 to disconnect the server liquid cooling loops from the rack distribution manifold.

Further, in an embodiment, this design 100 can be understood as either the rack manifold 103, including device (e.g., an electromagnet device 111) to push the server chassis 107 in response to a leakage detection. Alternatively, the server chassis 107 including a device (e.g., an electromagnet device 111) to push itself away from the rack manifold 103 in response to the leakage detection.

In an embodiment, a leaking sensor 105 is configured to detect leakage of the cooling fluid within the server chassis 107. In an embodiment, an electromagnet device 111 is coupled to the server connector module and the leaking sensor 105. Although not shown, server chassis 107 may contain one or more liquid cooling devices such as cold plates attached to one or more electronic devices (e.g., processors). The cooling devices are fluidly coupled to the rack manifold vis the server connectors engaged with the rack connectors. In the event of the cooling fluid leakage, leakage sensor 105 may detect such leakage. In response to the leakage detected by leakage sensor 105, a controller (not shown) is configured to control the connector module, i.e., the electromagnetic device of the connector module to move away from the rack manifold, either moving together with the server chassis or moving only the connector module while the server chassis remains steady.

Figure 2:
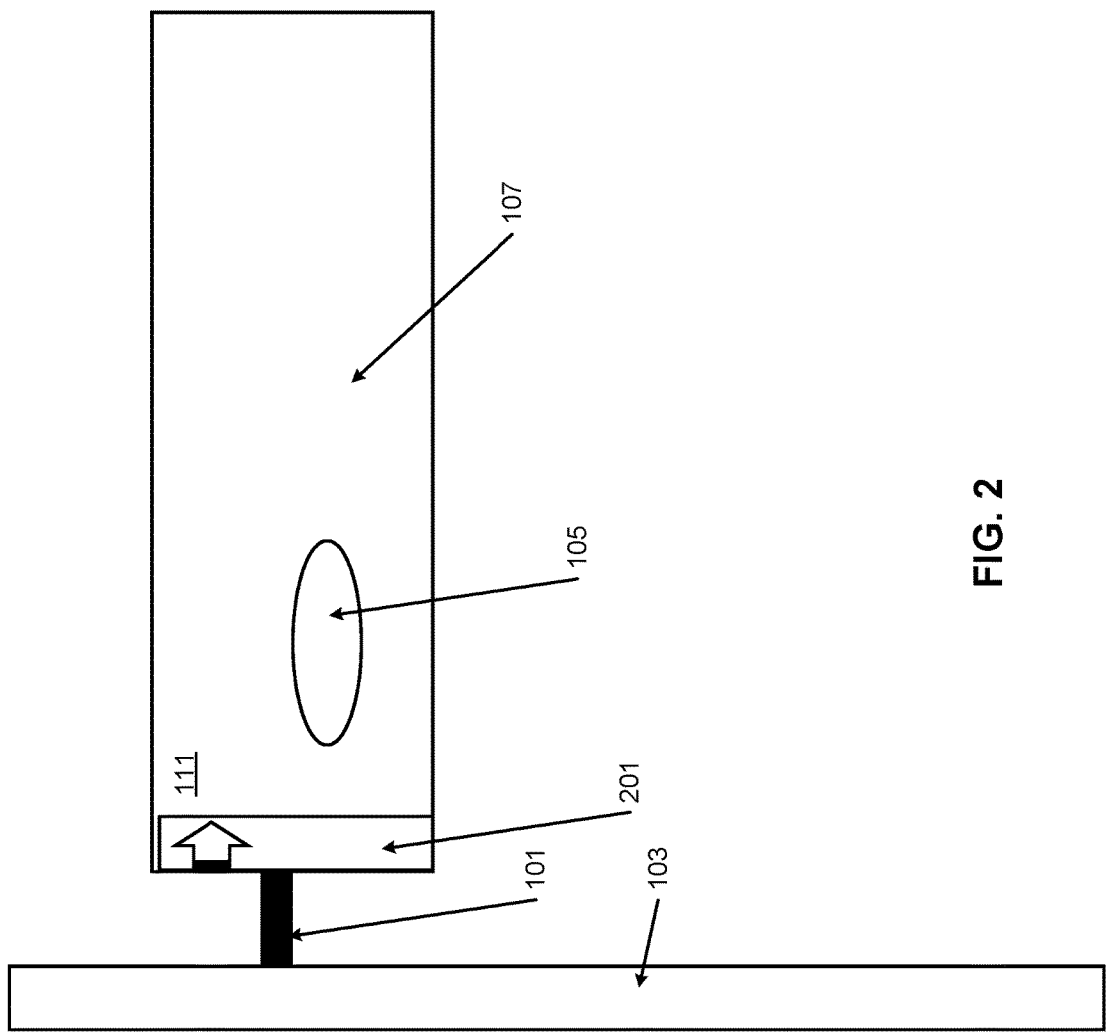
FIG. 2 shows a side view of another example server liquid cooling fluid cutoff design in a server level integration according to an embodiment of the application.

FIG. 2 shows a side view of another example server liquid cooling fluid cutoff design 200 in a server level integration, according to an embodiment of the application. For example, FIG. 2 shows the side view of another design 200. In an embodiment, in this design 200, the server connector module 201 is proposed and used. In an embodiment, the connector module 201 is attached onto the rear side of the server chassis 107 and the connector module 201 is assembled with blind mating connectors 101 as well as the device (e.g., an electromagnet device 111) proposed in the present application, or a similar device providing the concept proposed in the present application. In this example, connector module 201 is positioned within server chassis 107 near the rear panel of server chassis 107. In an embodiment, it is shown in FIG. 2 that the server connector module 201 is pushed away from the rear side of the server chassis 107, which means the server chassis 107 and the rack manifold 103 are to remain stationary when the liquid is cut. In an embodiment, this solution may enable the cutting of different liquid cooling loops separately within a single chassis (e.g., 107). In an embodiment, the server connector module 201 is attached onto a rear side of the server chassis 107 within the server chassis.

Figure 3:
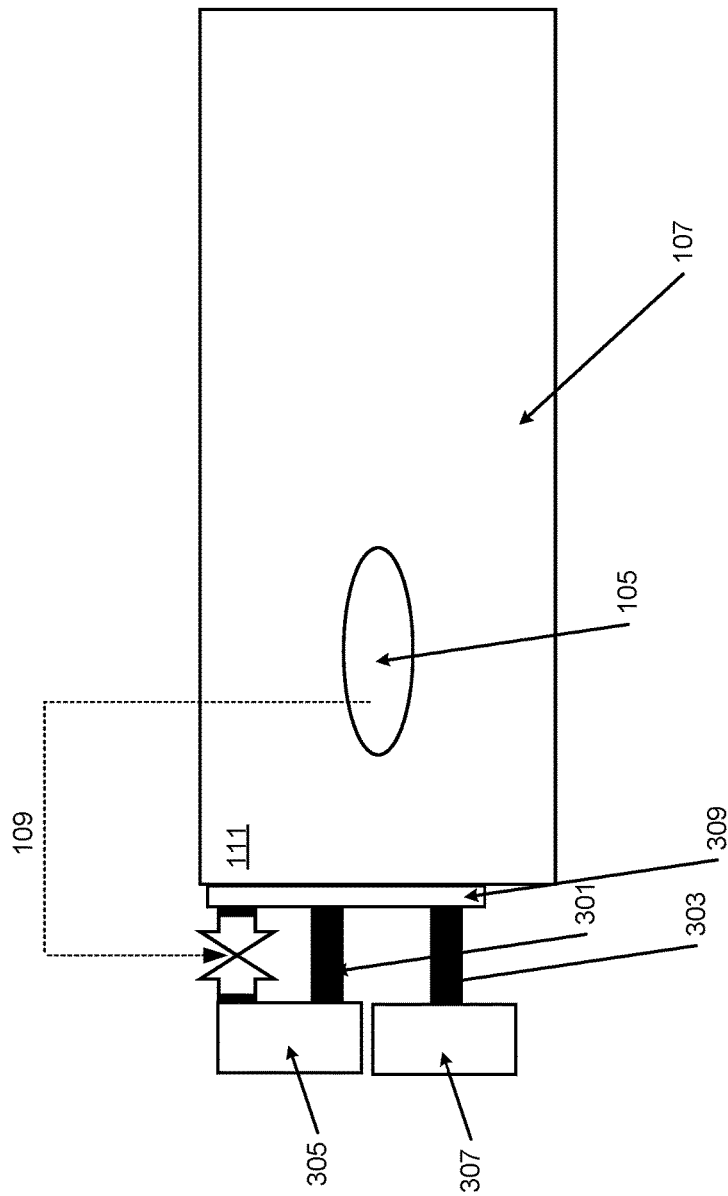
FIG. 3 shows a side view of another example server liquid cooling fluid cutoff design according to an embodiment of the application.

FIG. 3 shows a side view of another example server liquid cooling fluid cutoff design 300 according to an embodiment of the application. For example, FIG. 3 shows the plan view of the design 300. In an embodiment, it can be seen that FIG. 3 shows that the device (e.g., an electromagnet device 111) is integrated to the connector module 309. In an embodiment, the electromagnet device 111 has the ability to enable the connection of the connectors (e.g., 301, 303). For example, once the electromagnetic power is cut off, the connectors (e.g., 301, 303) are disconnected. In an embodiment, the electromagnet device 111 and an elastic structure (e.g., a spring) can be combined, and the electromagnet device 111 may push the server chassis 107 to disconnect. Further, in an embodiment, the pushing force can be provided by the elastic structure (e.g., a spring) since the counterforce by the electromagnet device 111 becomes released.

In an embodiment, during the normal operations, power is provided to the electromagnetic device. The elastic structure (not shown) is positioned between the connector module 309 and rack manifolds 305 and 307, such that due to the magnetic force generated by the electromagnetic device, the elastic structure is compressed while the connector module 309 is attracted towards the rack manifolds 305 and 307. In response to the leakage detection, the power to the electromagnetic device is cut off or reduced. As a result, the magnetic force disappears or is reduced and the compressed elastic structure is released to push at least the connector module 309 away from the rack manifolds 305 and 307, and the server connectors and the rack connectors are disengaged.

In an embodiment, the key feature for the design 300 is to disconnect the blind mating connectors (e.g., 301, 303) mechanically in a fluid leaking incident. In an embodiment, this can be realized either through mechanical design or electromagnet based design. In addition, in an embodiment, the device (e.g., an electromagnet device 111) can be either used to push the server chassis 107 away from the rack manifold (e.g., 305, 307) to disconnect the connectors (e.g., 301, 303), or push the connectors module 309 away from the rear side of the server chassis 107 to disconnect the connectors (e.g., 301, 303). In an embodiment, the connectors module 309 can be integrated with the electromagnet device 111 or the connectors (e.g., 301, 303) depends on where the elastic structure is located and being implemented, for pushing just the connectors module 309 or the entire server chassis 107 away. In an embodiment, the server connector module 309 is attached onto a rear side of the server chassis 107 outside of the server chassis 107.

Figure 4:
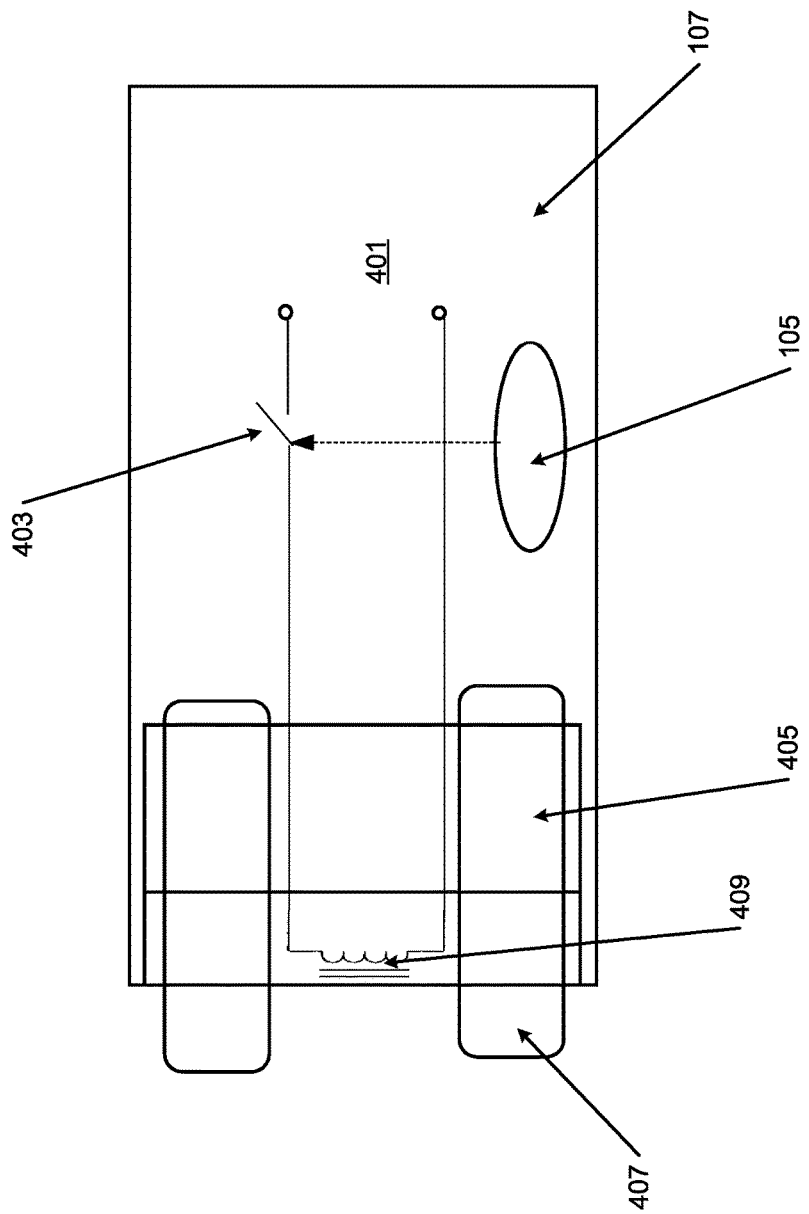
FIG. 4 shows an example of an electromagnet device for the server liquid cooling fluid cutoff system according to an embodiment of the application.

FIG. 4 shows an example of an electromagnet device 400 for the server liquid cooling fluid cutoff system according to an embodiment of the application. For example, FIG. 4 shows a design 400 for the device proposed in the present application. In an embodiment, an electromagnet device is used on the connector holder 405. In an embodiment, the electromagnet 409 is connected to an electrical circuit with a DC voltage source 401, which may be provided within server chassis 107. In an embodiment, a switch 403 is used on the circuit. In an embodiment, the switch 403 is controlled directly by a controller (not shown) in response to a signal received from the leaking sensor 105. In an embodiment, the loss of the DC source causes the loss of magnetism, which could cause the entire connector holder 405 to move in the positive horizontal directions. In an embodiment, as a result, the blind mating connectors (e.g., 407) are disconnected from the corresponding rack connector of the rack manifold (not shown). In an embodiment, when the force provided by the magnetism is loss, an elastic structure may be needed for the entire connector holder to move in the positive horizontal directions (e.g., from left to right in this example). For example, this elastic structure can be a spring based structure located on the left hand side of the electromagnet 409 between the server chassis 107 and the connector holder 405.

Further, in an embodiment, there are some additional important features which can be integrated into the present application. For example, since the device is DC source 401 based, it's much more accessible to be designed and operated upon since the power source is cut off in a leaking incident. In an embodiment, this can be directly utilizing the power cutoff signal and control, and/or server shutdown sequence.

Further, in an embodiment, the design 400 may also be used for cutting the fluid in normal service scenarios, not only in a leakage scenario. In an embodiment, the electromagnet 409 is connected to an electrical circuit coupled with a direct current (DC) voltage source 401.

In an embodiment, the electromagnet device comprises an electromagnet 409 and a controller. For example, a controller is coupled to the electromagnet 409. In an embodiment, in response to a leakage signal received from the leaking sensor indicating that a fluid leakage occurs, the controller/device will modify a magnetic field/force associated with the electromagnet 409, which causes at least one of the server blind mating connectors (e.g., 407) to disengage from at least one of the rack blind mating connectors.

In an embodiment, the controller having a switch 401 used on the electrical circuit controlled by the leaking sensor 105. In an embodiment, the server connector module is pushed away from the server chassis 107 when the magnetic field associated with the electromagnet 409 is modified to loss magnetism, which causes at least one of the server blind mating connectors (e.g., 407) to disengage from at least one of the rack blind mating connectors. In an embodiment, when the server connector module is pushed away from the server chassis 107, the server chassis 107 and the rack manifold are remained without moving.

Figure 5:
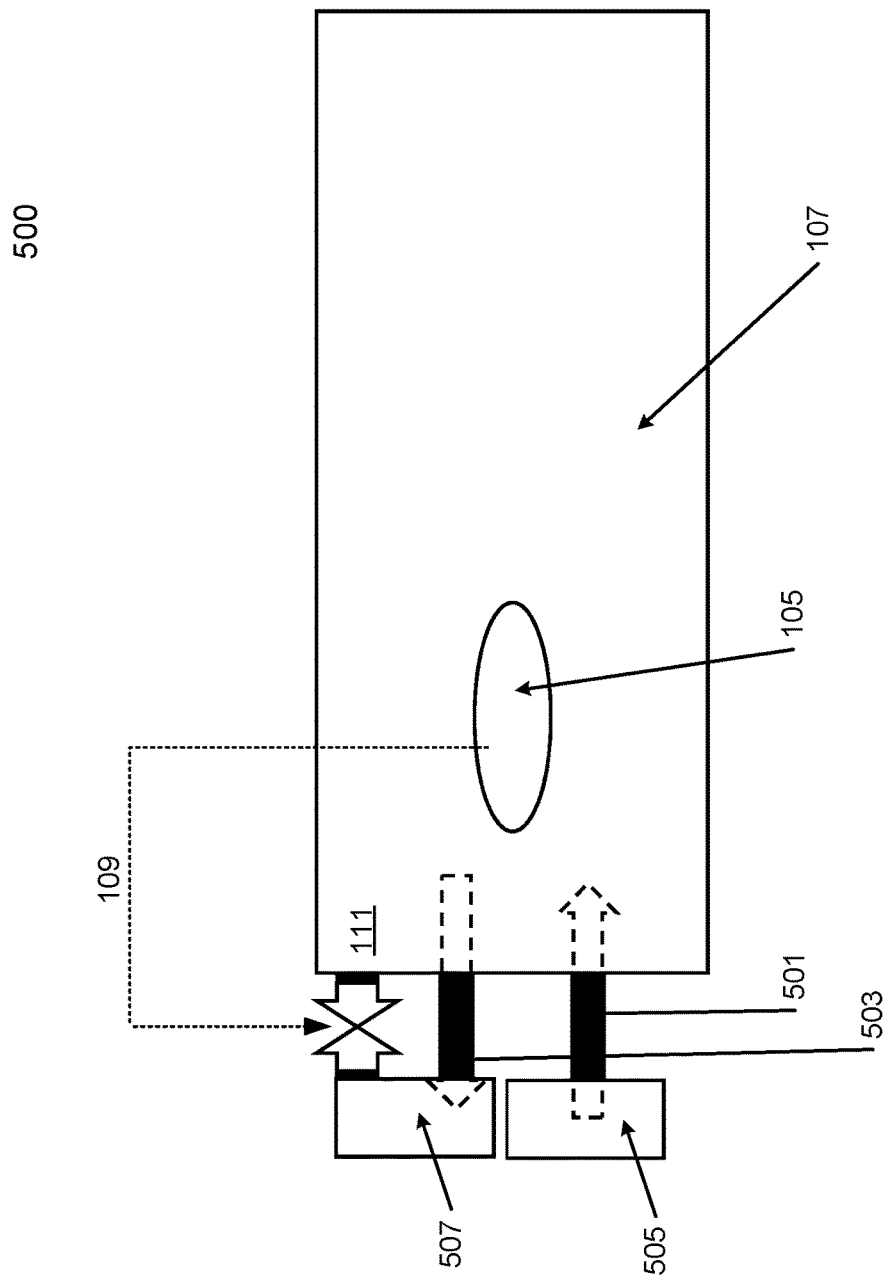
FIG. 5 shows an example system operation during normal conditions of server liquid cooling fluid cutoff design according to an embodiment of the application.

FIG. 5 shows an example system operation during normal conditions of server liquid cooling fluid cutoff design 500, according to an embodiment of the application. For example, FIG. 5 shows the system in a normal operation mode, where the connectors (e.g., 501, 503) are connected to the fluid full circuit to form the server cooling module.

In an embodiment, the server blind mating connectors (e.g., 501, 503) are configured to supply cooling fluid to one or more cooling devices attached to one or more electronic devices contained within the server chassis 107 for providing liquid cooling. In an embodiment, the pair of server blind mating connectors include a supply connector 501 coupled with the server chassis 107 through a supply connector holder to supply the cooling fluid to flow from the rack manifold 505 to the server chassis 107. In an embodiment, the pair of server blind mating connectors include a return connector 507 coupled with the server chassis 107 through a return connector holder to return the cooling fluid to flow from the server chassis 107 to the rack manifold 507.

Figure 6:
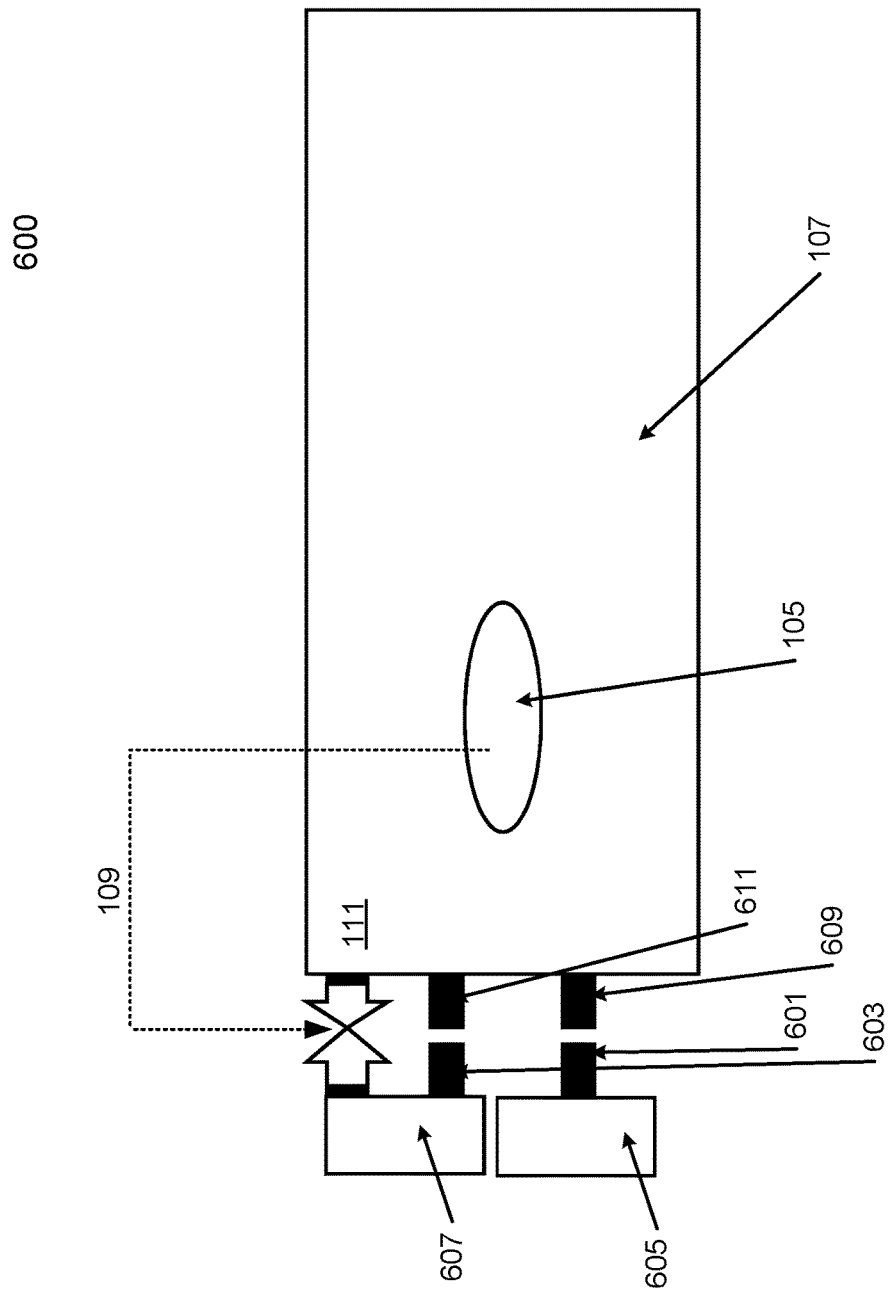
FIG. 6 shows another example system operation during leakage scenario for the server liquid cooling fluid cutoff system according to an embodiment of the application.

FIG. 6 shows another example system operation during a leakage scenario for the server liquid cooling fluid cutoff system 600, according to an embodiment of the application. For example, FIG. 6 shows the system in a leaking incident, where the device 111 functions and the blind mating connectors (e.g., 601, 603) disconnected and the fluid circuit is open/interrupted.

In an embodiment, a server connector module having a pair of server blind mating connectors (e.g., 609, 611) is capable of being engaged with or disengaged from a pair of rack blind mating connectors (e.g., 601, 603) of a rack manifold (e.g., 605, 607) of the electronic rack coupled to an external cooling fluid source.

In an embodiment, the supply connector 601 is pushed away from the server chassis 107, the cooling fluid is prevented to flow from the rack manifold 605 to the server chassis 107. In an embodiment, the return connector 603 is pushed away from the server chassis 107, the cooling fluid is prevented to flow from the server chassis 107 to the rack manifold 607.

Figure 7:
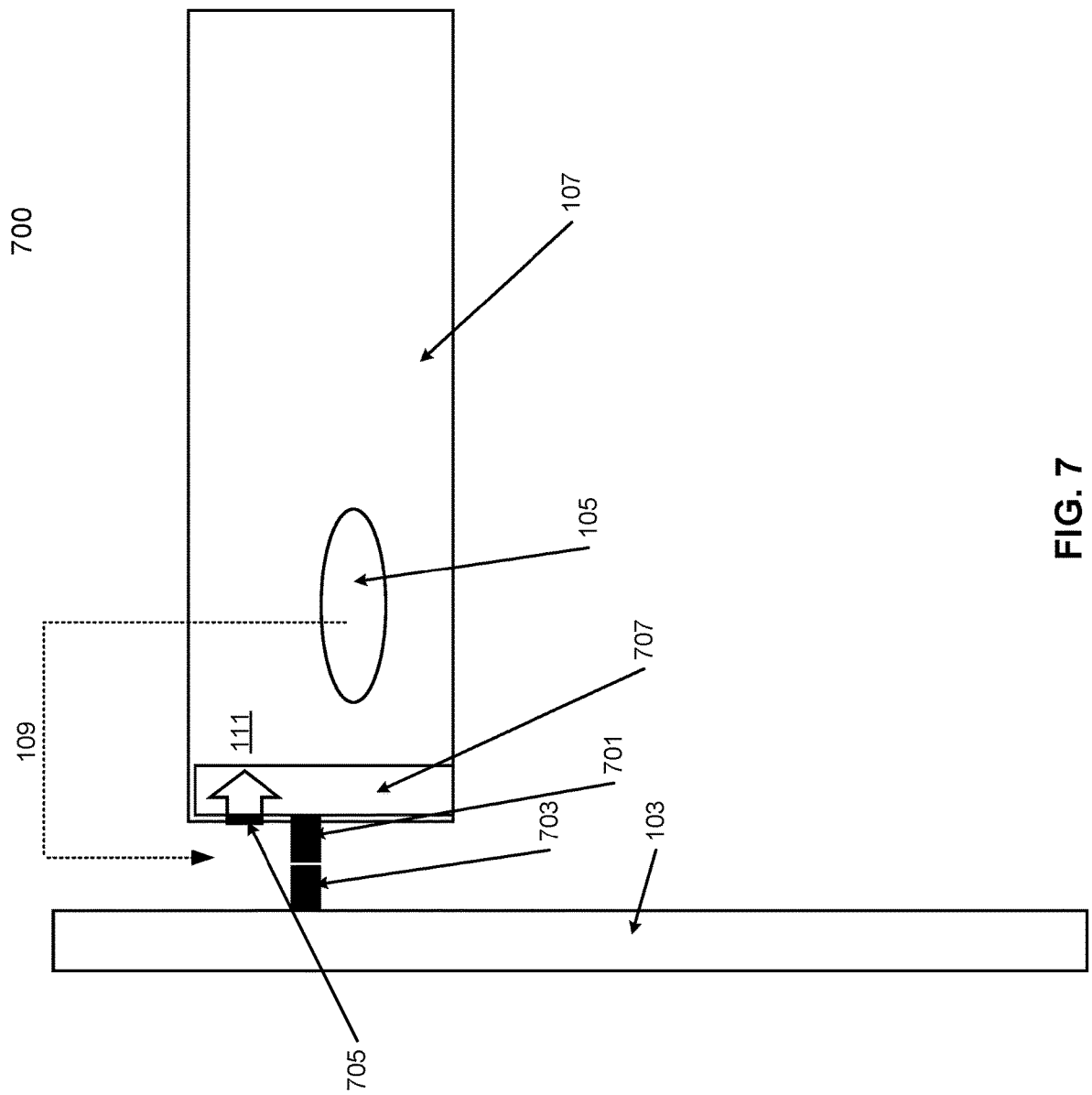
FIG. 7 shows a side view of another example system operation according to an embodiment of the application.

FIG. 7 shows a side view of another example system operation according to an embodiment of the application. For example, FIG. 7 shows that the device 111 is integrated and combined on the server connector module 707. In an embodiment, the separation process 705 is triggered by the sensor 105, and to push the connectors 703 away from the server blind mating connector 701/server chassis 107. In an embodiment, the rack manifold 103 and the server chassis 107 are kept in their original locations.

In an embodiment, the server connector module 707 is pushed away from the server chassis 107 when the magnetic field associated with the electromagnet is modified to loss magnetism, which causes at least one of the server blind mating connectors (e.g., 701) to disengage from at least one of the rack blind mating connectors (e.g., 703).

In an embodiment, the server connector module 707 is pushed away from the rack manifold 103 when the electromagnet device 111 losses magnetism, which causes at least one of the server blind mating connectors (e.g., 701) to disengage from at least one of the rack blind mating connectors (e.g., 703).

In an embodiment, different mechanisms or structure designs can be used to realize the concept proposed. In an embodiment, the above solutions and designs can also be used for electronics in other areas, such as in vehicle computing systems. In an embodiment, the device 111 can be designed or integrated on the rack side 103.

Figure 8:
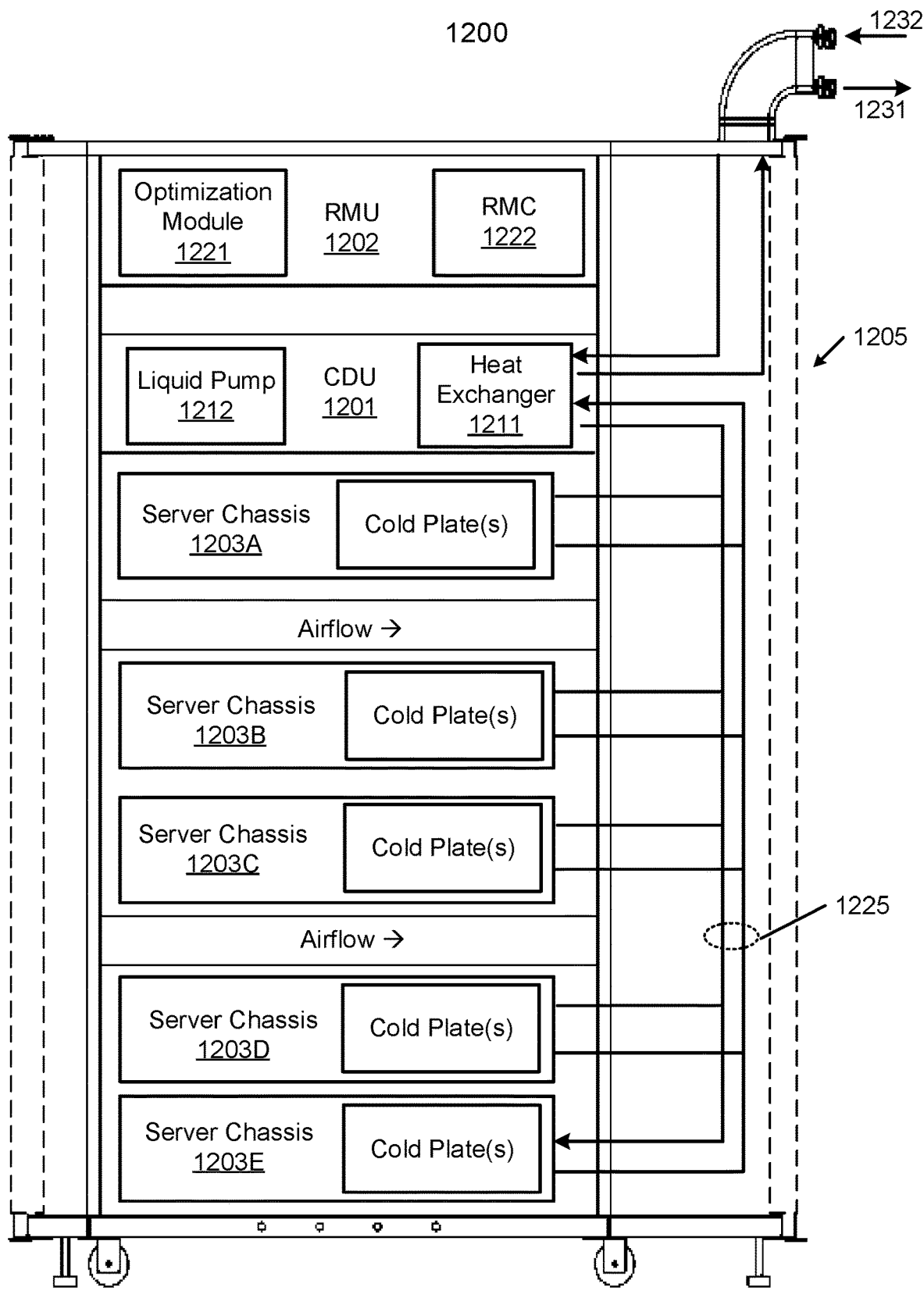
FIG. 8 is a block diagram illustrating an example of an electronic rack according to one embodiment.

FIG. 8 is block diagram illustrating an electronic rack according to one embodiment. Electronic rack 1200 may represent any of the electronic racks as described throughout this application. According to one embodiment, electronic rack 1200 includes, but is not limited to, coolant distribution unit (CDU) 1201, rack management unit (RMU) 1202, and one or more server chassis 1203A-1203E (collectively referred to as server chassis 1203). Server chassis 1203 can be inserted into an array of server slots (e.g., standard shelves) respectively from frontend 1204 or backend 1205 of electronic rack 1200. Note that although there are five server chassis 1203A-1203E shown here, more or fewer server chassis may be maintained within electronic rack 1200. Also note that the particular positions of CDU 1201, RMU 1202, and/or server chassis 1203 are shown for the purpose of illustration only; other arrangements or configurations of CDU 1201, RMU 1202, and/or server chassis 1203 may also be implemented. In one embodiment, electronic rack 1200 can be either open to the environment or partially contained by a rack container, as long as the cooling fans can generate airflows from the frontend to the backend.

In addition, for at least some of the server chassis 1203, an optional fan module (not shown) is associated with the server chassis. Each of the fan modules includes one or more cooling fans. The fan modules may be mounted on the back-ends of server chassis 1203 or on the electronic rack to generate airflows flowing from frontend 1204, traveling through the air space of the server chassis 1203, and existing at backend 1205 of electronic rack 1200.

In one embodiment, CDU 1201 mainly includes heat exchanger 1211, liquid pump 1212, and a pump controller (not shown), and some other components such as a liquid reservoir, a power supply, monitoring sensors and so on. Heat exchanger 1211 may be a liquid-to-liquid heat exchanger. Heat exchanger 1211 includes a first loop with inlet and outlet ports having a first pair of liquid connectors coupled to external liquid supply/return lines 1231-1232 to form a primary loop. The connectors coupled to the external liquid supply/return lines 1231-1232 may be disposed or mounted on backend 1205 of electronic rack 1200. The liquid supply/return lines 1231-1232, also referred to as room liquid supply/return lines, may be coupled to an external cooling system.

In addition, heat exchanger 1211 further includes a second loop with two ports having a second pair of liquid connectors coupled to liquid manifold 1225 (also referred to as a rack manifold) to form a secondary loop, which may include a supply manifold (also referred to as a rack liquid supply line or rack supply manifold) to supply cooling liquid to server chassis 1203 and a return manifold (also referred to as a rack liquid return line or rack return manifold) to return warmer liquid back to CDU 1201. Note that CDUs 1201 can be any kind of CDUs commercially available or customized ones. Thus, the details of CDUs 1201 will not be described herein.

Each of server chassis 1203 may include one or more IT components (e.g., central processing units or CPUs, general/graphic processing units (GPUs), memory, and/or storage devices). Each IT component may perform data processing tasks, where the IT component may include software installed in a storage device, loaded into the memory, and executed by one or more processors to perform the data processing tasks. Server chassis 1203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Electronic rack 1200 further includes optional RMU 1202 configured to provide and manage power supplied to servers 1203, and CDU 1201. RMU 1202 may be coupled to a power supply unit (not shown) to manage the power consumption of the power supply unit. The power supply unit may include the necessary circuitry (e.g., an alternating current (AC) to direct current (DC) or DC to DC power converter, battery, transformer, or regulator, etc.) to provide power to the rest of the components of electronic rack 1200.

In one embodiment, RMU 1202 includes optimization module 1221 and rack management controller (RMC) 1222. RMC 1222 may include a monitor to monitor operating status of various components within electronic rack 1200, such as, for example, computing nodes 1203, CDU 1201, and the fan modules. Specifically, the monitor receives operating data from various sensors representing the operating environments of electronic rack 1200. For example, the monitor may receive operating data representing temperatures of the processors, cooling liquid, and airflows, which may be captured and collected via various temperature sensors. The monitor may also receive data representing the fan power and pump power generated by the fan modules and liquid pump 1212, which may be proportional to their respective speeds. These operating data are referred to as real-time operating data. Note that the monitor may be implemented as a separate module within RMU 1202.

Based on the operating data, optimization module 1221 performs an optimization using a predetermined optimization function or optimization model to derive a set of optimal fan speeds for the fan modules and an optimal pump speed for liquid pump 1212, such that the total power consumption of liquid pump 1212 and the fan modules reaches minimum, while the operating data associated with liquid pump 1212 and cooling fans of the fan modules are within their respective designed specifications. Once the optimal pump speed and optimal fan speeds have been determined, RMC 1222 configures liquid pump 1212 and cooling fans of the fan modules based on the optimal pump speeds and fan speeds.

As an example, based on the optimal pump speed, RMC 1222 communicates with a pump controller of CDU 1201 to control the speed of liquid pump 1212, which in turn controls a liquid flow rate of cooling liquid supplied to the liquid manifold 1225 to be distributed to at least some of server chassis 1203. Similarly, based on the optimal fan speeds, RMC 1222 communicates with each of the fan modules to control the speed of each cooling fan of the fan modules, which in turn control the airflow rates of the fan modules. Note that each of fan modules may be individually controlled with its specific optimal fan speed, and different fan modules and/or different cooling fans within the same fan module may have different optimal fan speeds.

Note that the rack configuration as shown is described for the purpose of illustration only; other configurations or arrangements may also be applicable. For example, CDU 1201 may be an optional unit. The cold plates of server chassis 1203 may be coupled to a rack manifold, which may be directly coupled to room manifolds 1231-1232 without using a CDU. Although not shown, a power supply unit may be disposed within electronic rack 1200. The power supply unit may be implemented as a standard chassis identical or similar to a server chassis, where the power supply chassis can be inserted into any of the standard shelves, replacing any of server chassis 1203. In addition, the power supply chassis may further include a battery backup unit (BBU) to provide battery power to server chassis 1203 when the main power is unavailable. The BBU may include one or more battery packages and each battery package include one or more battery cells, as well as the necessary charging and discharging circuits for charging and discharging the battery cells.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A server chassis of an electronic rack, comprising:
    a server connector module having a pair of server blind mating connectors capable of being engaged with or disengaged from a pair of rack blind mating connectors of a rack manifold of the electronic rack coupled to an external cooling fluid source, wherein the server blind mating connectors are configured to supply cooling fluid to one or more cooling devices attached to one or more electronic devices contained within the server chassis for providing liquid cooling;
    a leaking sensor configured to detect leakage of the cooling fluid within the server chassis;
    an electromagnet device coupled to the server connector module and the leaking sensor, the electromagnet device comprising:
        an electromagnet, and
        a controller coupled to the electromagnet, in response to a leakage signal received from the leaking sensor indicating that a fluid leakage occurs, to modify a magnetic field associated with the electromagnet, which causes at least one of the server blind mating connectors to disengage from at least one of the rack blind mating connectors.

2. The server chassis of claim 1, wherein the server connector module is attached onto a rear side of the server chassis within the server chassis.

3. The server chassis of claim 1, wherein the electromagnet is connected to the electrical circuit coupled with a direct current (DC) voltage source.

4. The server chassis of claim 3, wherein the controller is coupled to a switch on the electrical circuit to provide power or cut off the power to the electromagnet in response to leakage signal received from the leaking sensor.

5. The server chassis of claim 1, wherein the server connector module is pushed away from the server chassis when the magnetic field associated with the electromagnet is modified to loss magnetism, which causes at least one of the server blind mating connectors to disengage from at least one of the rack blind mating connectors.

6. The server chassis of claim 5, wherein when the server connector module is pushed away from the server chassis, the server chassis and the rack manifold are remained without moving.

7. The server chassis of claim 1, wherein the pair of server blind mating connectors include a supply and return connector coupled with the server chassis through a supply and return connector holder to supply the cooling fluid to flow from the rack manifold to the server chassis.

8. The server chassis of claim 1, wherein the server connector module is pushed away from the server chassis when the magnetic field associated with the electromagnet is modified to loss magnetism, and wherein the server connector module is pulled in toward to the server chassis when the magnetic field associated with the electromagnet is modified to have magnetism, which causes at least one of the server blind mating connectors to engage from at least one of the rack blind mating connectors.

9. The server chassis of claim 1, wherein the supply connector is pushed away from the server chassis, the cooling fluid is prevented to flow from the rack manifold to the server chassis.

10. The server chassis of claim 1, wherein the return connector is pushed away from the server chassis, the cooling fluid is prevented to flow from the server chassis to the rack manifold.

11. The server chassis of claim 1, wherein the server connector module is attached onto a rear side of the server chassis outside of the server chassis.

12. The server chassis of claim 1, wherein the server connector module is pushed away from the server chassis when the magnetic field associated with the electromagnet is modified to loss magnetism, which causes at least one of the server blind mating connectors to disengage from at least one of the rack blind mating connectors.

13. The server chassis of claim 12, wherein the server connector module is pulled in toward to the server chassis when the magnetic field associated with the electromagnet is modified to have magnetism, which causes at least one of the server blind mating connectors to engage from at least one of the rack blind mating connectors.

14. An electronic rack, comprising:
a rack manifold coupled to an external cooling fluid source to receive and to return cooling fluid from and to the external cooling fluid source, wherein the rack manifold comprises a plurality of pairs of rack blind mating connectors; and
a plurality of server chassis arranged in a stack, wherein each server chassis comprises:
a server connector module having a pair of server blind mating connectors capable of being engaged with or disengaged from one of the pairs of the rack blind mating connectors of the rack manifold, wherein the server blind mating connectors are configured to supply cooling fluid to one or more cooling devices attached to one or more electronic devices contained within the server chassis for providing liquid cooling;
a leaking sensor configured to detect leakage of the cooling fluid within the server chassis;
an electromagnet device coupled to the server connector module and the leaking sensor, the electromagnet device comprising:
an electromagnet, and
a controller coupled to the electromagnet, in response to a leakage signal received from the leaking sensor indicating that a fluid leakage occurs, to modify a magnetic field associated with the electromagnet, which causes at least one of the server blind mating connectors to disengage from at least one of the rack blind mating connectors.

15. The electronic rack of claim 14, wherein the server connector module is attached onto a rear side of the server chassis within the server chassis.

16. The electronic rack of claim 14, wherein the electromagnet is connected to the electrical circuit coupled with a direct current (DC) voltage source.

17. The electronic rack of claim 16, wherein the controller is coupled to a switch on the electrical circuit to provide power or cut off the power to the electromagnet in response to leakage signal received from the leaking sensor.

18. The electronic rack of claim 14, wherein the server connector module is pushed away from the server chassis when the magnetic field associated with the electromagnet is modified to loss magnetism, which causes at least one of the server blind mating connectors to disengage from at least one of the rack blind mating connectors.

19. The electronic rack of claim 18, wherein when the server connector module is pushed away from the server chassis, the server chassis and the rack manifold are remained without moving.

20. A server liquid cooling fluid cutoff system, comprising:
a server connector module to be mounted on a server chassis of an electronic rack, the server connector module having a pair of server blind mating connectors capable of being engaged with or disengaged from a pair of rack blind mating connectors of a rack manifold of the electronic rack coupled to an external cooling fluid source, wherein the server blind mating connectors are configured to supply cooling fluid to one or more cooling devices attached to one or more electronic devices contained within the server chassis for providing liquid cooling;
a leaking sensor configured to detect leakage of the cooling fluid within the server chassis;
an electromagnet device coupled to the server connector module and the leaking sensor, the electromagnet device comprising:
an electromagnet, and
a controller coupled to the electromagnet, in response to a leakage signal received from the leaking sensor indicating that a fluid leakage occurs, to modify a magnetic field associated with the electromagnet, which causes at least one of the server blind mating connectors to disengage from at least one of the rack blind mating connectors.

* * * * *